US011456047B2

(12) United States Patent
Zhang et al.

(10) Patent No.: US 11,456,047 B2
(45) Date of Patent: Sep. 27, 2022

(54) FLASH MEMORY DEVICE WITH PROGRAMMABLE LOGIC CIRCUIT

(71) Applicant: Yangtze Memory Technologies Co., Ltd., Hubei (CN)

(72) Inventors: Huangpeng Zhang, Wuhan (CN); Shiyang Yang, Wuhan (CN); Yu Wang, Wuhan (CN); Huamin Cao, Wuhan (CN); Ting Li, Wuhan (CN); Xu Hou, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 17/190,575

(22) Filed: Mar. 3, 2021

(65) Prior Publication Data

US 2022/0051743 A1 Feb. 17, 2022

Related U.S. Application Data

(63) Continuation of application No. PCT/CN2020/108789, filed on Aug. 13, 2020.

(51) Int. Cl.
  *G11C 29/42* (2006.01)
  *G11C 7/20* (2006.01)
  *G11C 29/44* (2006.01)
  *G11C 29/00* (2006.01)
  *H03K 19/17728* (2020.01)

(52) U.S. Cl.
  CPC .............. *G11C 29/42* (2013.01); *G11C 7/20* (2013.01); *G11C 29/44* (2013.01); *G11C 29/76* (2013.01); *H03K 19/17728* (2013.01)

(58) Field of Classification Search
  CPC .......... G11C 29/42; G11C 29/44; G11C 29/76; G11C 7/20; H03K 19/17728
  See application file for complete search history.

(56) References Cited

U.S. PATENT DOCUMENTS 7,190,190 B1 * 3/2007 Camarota ................ G11C 7/20
                                                    326/38
7,350,177 B2    3/2008 Chung et al.
(Continued)

FOREIGN PATENT DOCUMENTS

CN    1855485 A    11/2006
CN    1881471 A    12/2006
(Continued)

OTHER PUBLICATIONS

Combined Chinese Office Action and Search Report dated Sep. 3, 2021 in Chinese Patent Application No. 202080001907.3 (with English translation of Categories of Cited Documents), 8 pages.
(Continued)

*Primary Examiner* — Sultana Begum
(74) *Attorney, Agent, or Firm* — Oblon, McClelland, Maier & Neustadt, L.L.P.

(57) ABSTRACT

Aspects of the disclosure provide a semiconductor memory device. The semiconductor memory device includes a memory cell array and peripheral circuitry coupled with the memory cell array. The memory cell array includes a plurality of memory cells. The peripheral circuitry includes programmable logic circuit that is configured, after the semiconductor memory device is powered on, to perform logic functions.

19 Claims, 6 Drawing Sheets

(56) References Cited

U.S. PATENT DOCUMENTS

| | | | |
|---|---|---|---|
| 7,558,143 B1 * | 7/2009 | Law | H03K 19/17784 365/228 |
| 7,652,920 B2 | 1/2010 | Seta et al. | |
| 8,105,885 B1 | 1/2012 | Lee et al. | |
| 8,716,809 B2 | 5/2014 | Lee et al. | |
| 9,183,939 B2 | 11/2015 | Nam et al. | |
| 9,224,491 B1 | 12/2015 | Somaiya | |
| 9,654,109 B2 | 5/2017 | Lee et al. | |
| 9,666,270 B2 | 5/2017 | You | |
| 9,851,899 B2 | 12/2017 | You | |
| 2005/0248366 A1 | 11/2005 | Chung et al. | |
| 2006/0279984 A1 | 12/2006 | Seta et al. | |
| 2012/0032702 A1 | 2/2012 | Lee et al. | |
| 2012/0098569 A1 | 4/2012 | Lee et al. | |
| 2014/0218068 A1 | 8/2014 | Lee et al. | |
| 2015/0003169 A1 | 1/2015 | Nam et al. | |
| 2016/0372186 A1 | 12/2016 | You | |
| 2017/0083454 A1 | 3/2017 | Ramalingam et al. | |
| 2017/0229168 A1 | 8/2017 | You | |
| 2019/0103162 A1 | 4/2019 | Asnaashari et al. | |

FOREIGN PATENT DOCUMENTS

| | | |
|---|---|---|
| CN | 1917082 A | 2/2007 |
| CN | 103155414 A | 6/2013 |
| CN | 104252880 A | 12/2014 |
| CN | 106257593 A | 12/2016 |

OTHER PUBLICATIONS

International Search Report dated May 12, 2021 in PCT/CN2020/108789 filed Aug. 13, 2020, 5 pages.

* cited by examiner

FLASH MEMORY DEVICE WITH PROGRAMMABLE LOGIC CIRCUIT

RELATED APPLICATION

This application is a bypass continuation of International Application No. PCT/CN2020/108789, filed on Aug. 13, 2020. The entire disclosure of the prior application is hereby incorporated by reference in its entirety.

TECHNICAL FIELD

The present application describes embodiments generally related to semiconductor memory devices.

BACKGROUND

Semiconductor memory devices can be categorized into volatile memory devices and non-volatile memory devices. The volatile memory devices lost data when power is off. The non-volatile memory devices can retain stored data even power is disconnected. To achieve higher data storage density, semiconductor manufactures developed vertical device technologies, such as three dimensional (3D) NAND flash memory technology, and the like. 3D NAND flash memory device is a kind of non-volatile memory devices.

SUMMARY

Aspects of the disclosure provide a semiconductor memory device. The semiconductor memory device includes a memory cell array and peripheral circuitry coupled with the memory cell array. The memory cell array includes a plurality of memory cells. The peripheral circuitry includes programmable logic circuit that is configured, after the semiconductor memory device is powered on, to perform logic functions.

In some embodiments, the memory cell array includes non-volatile memory cells that store configuration information for configuring the programmable logic circuit. In an embodiment, the peripheral circuitry loads the configuration information from the memory cell array, and configures the programmable logic circuit according to the configuration information at a time when the semiconductor memory device is powered on. In some examples, the configuration information for configuring the programmable logic circuit is stored in an initialization partition of the memory cell array. Information in the initialization partition is read in response to a power-on of the semiconductor memory device.

In some embodiments, the programmable logic circuit includes at least a lookup table for a plurality of logic inputs. The lookup table comprises entries that respectively associate binary combinations of the logic inputs with random access memory cells. In some examples, the peripheral circuitry is configured to store values into the random access memory cells according to the configuration information at the time when the semiconductor memory device is powered on.

In an embodiment, the programmable logic circuit is configured to perform determination of word line bias settings for the memory cell array. In another embodiment, the programmable logic circuit is configured to perform calculation of voltage levels for programing/erasing/read the memory cell array. In another embodiment, the programmable logic circuit is configured to perform build-in-self-test (BIST) functions. In another embodiment, the programmable logic circuit is configured to perform error detection and correction functions. In another embodiment, the programmable logic circuit is configured to perform address translation between a file system and the memory cell array.

In some embodiments, the memory cell array is disposed on a first die and the peripheral circuitry is disposed on a second die that is conductively coupled with the first die.

In some embodiments, the peripheral circuity is configured to receive configuration signals from a source external of the semiconductor memory device, and configure the programmable logic circuit according to the configuration signals.

Aspects of the disclosure provide a method for forming a semiconductor memory device. In some embodiments, the method includes determining logic functions for programmable logic circuit that is disposed in peripheral circuitry for a memory cell array in the semiconductor memory device. The memory cell array includes non-volatile memory cells. Further, the method includes determining configuration information for configuring the programmable logic circuit to perform the logic functions, and storing the configuration information in the non-volatile memory cells. The configuration information is used to configure the programmable logic circuit when the semiconductor memory device is powered on.

Aspects of the disclosure also provide a method for using a semiconductor memory device. The method includes receiving configuration information for configuring programmable logic circuit that is disposed in peripheral circuitry of a memory cell array in the semiconductor memory device. The memory cell array includes non-volatile memory cells. The method further includes storing the configuration information in the non-volatile memory cells. The configuration information is used to configure the programmable logic circuit when the semiconductor memory device is powered on.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
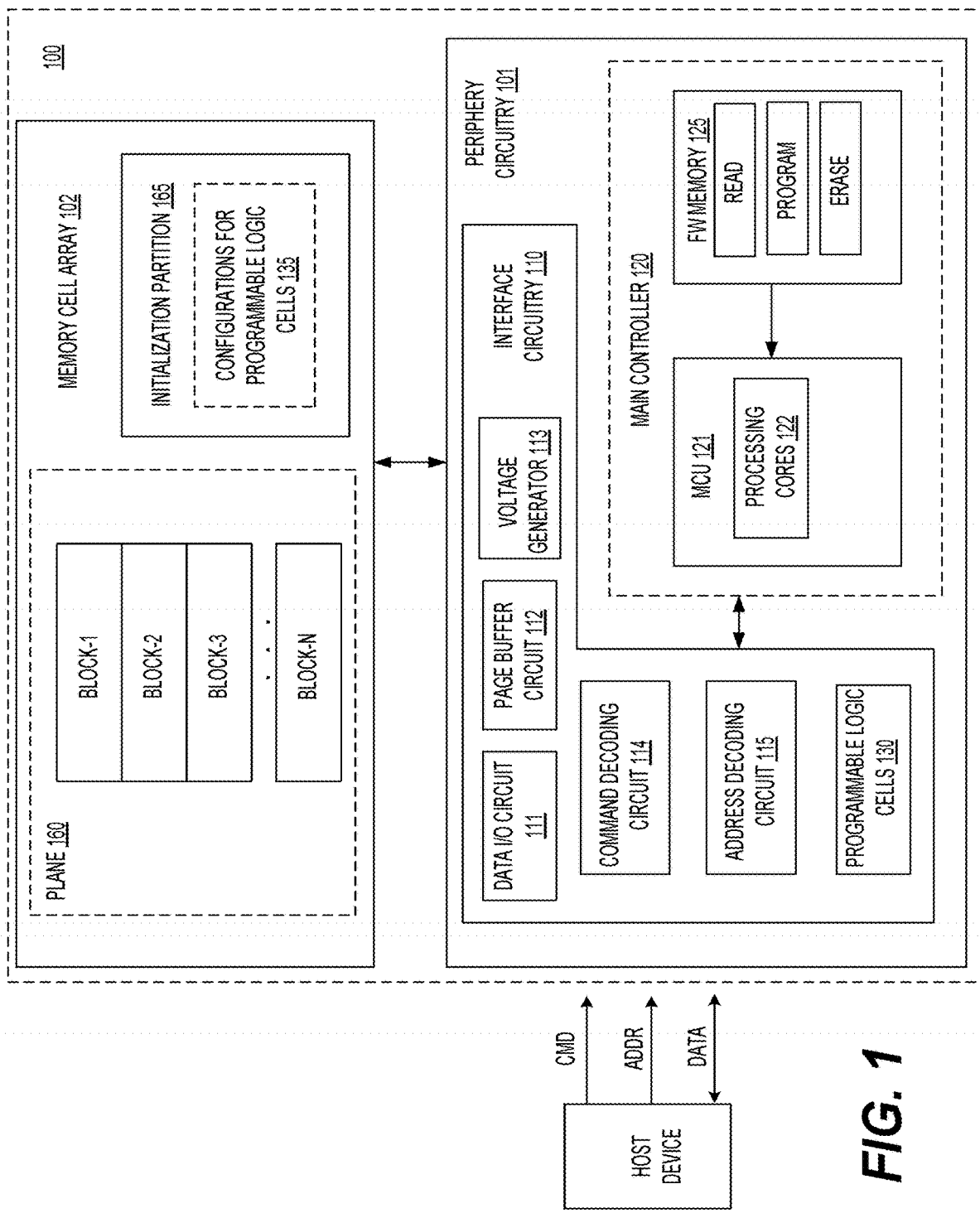
FIG. 1 shows a block diagram of a semiconductor memory device according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Aspects of the disclosure provide architecture of flash memory devices and techniques for use with the flash memory devices. Generally, a flash memory device includes a memory cell array portion and a peripheral portion. The peripheral portion interfaces the memory cell array portion with external circuitry and provides various controls to the memory cell array portion.

According to some aspects of the disclosure, the peripheral portion includes programmable logic circuitry with logics that can be configured after the fabrication of the flash memory device, such as after the memory cell array portion and the peripheral portion are coupled together, after a test or characterization step, by a user (user programmable), and the like. In some embodiments, configurations of the programmable logic circuitry can be stored in the memory cell array portion, and the programmable logic circuitry can be logically configured based on the stored configurations in the memory cell array portion. In some embodiments, the programmable logic circuitry can be logically configured based on configurations from external sources.

According to an aspect of the disclosure, the programmable logic circuitry can be used to implement functions that may require more flexible decision time, and thus is difficult to achieve by regular hardware implementation. According to another aspect of the disclosure, the programmable logic circuitry can be used to implement functions that may require fast processing speed that is hard for firmware based implementation.

In an embodiment, the programmable logic circuitry is used to implement functions that are not certain at the time of hardware design, and are determined after hardware validation. In another embodiment, the programmable logic circuitry is used to fix bugs in hardware. In another embodiment, the programmable logic circuitry is used to implement functions requested from customer feedback.

In another embodiment, the programmable logic circuitry is used to implement functions that may rely on testing or characterization, such as determination of word line bias settings, control voltage calculations, and the like. In another embodiment, the programmable logic circuitry is used to implement build-in-self-test (BIST) functions. In another embodiment, the programmable logic circuitry is used to implement an error correcting code (ECC) engine. In another embodiment, the programmable logic circuitry is used to implement functions that may require fast processing, such as functions in flash translation layer (FTL), and the like.

FIG. 1 shows a block diagram of a semiconductor memory device 100 according to some embodiments of the disclosure. The semiconductor memory device 100 includes a memory cell array 102 and peripheral circuitry 101 coupled together. In some examples, the memory cell array 102 and the peripheral circuitry 101 are disposed on a same die (chip). In other examples, the memory cell array 102 is disposed on an array die, the peripheral circuitry 101 is disposed on a different die, such as a die that is implemented using complementary metal-oxide-semiconductor (CMOS) technology and is referred to as CMOS die. The array die and the CMOS die are suitably bonded, and electrically coupled together. An example of bonded array die and CMOS die will be described with reference to FIG. 2.

In some examples, a CMOS die can be coupled with multiple array dies. In an embodiment, the semiconductor memory device 100 is an integrated circuit (IC) package that encapsulates one or more array dies and one or more CMOS dies.

The semiconductor memory device 100 is configured to store data in the memory cell array 102, and perform operations in response to received commands (CMD). In some examples, the semiconductor memory device 100 can receive write command (also referred to as program command), read command, erase command and the like, and operate accordingly. In an example, the semiconductor memory device 100 receives a write command with an address (ADDR) and data (DATA), the semiconductor memory device 100 then stores the data in the memory cell array 102 at the address. In another example, the semiconductor memory device 100 receives a read command with an address, the semiconductor memory device 100 then accesses the memory cell array 102, and outputs data stored at the address of the memory cell array 102. In another example, the semiconductor memory device 100 receives an erase command with an address, the semiconductor memory device 100 then resets one or more blocks of memory cells at the address to an un-programed state (also referred to as erased state), such as "1" for NAND memory cells.

Generally, the memory cell array 102 can include one or more memory planes 160, and each of memory planes 160 can include a plurality of memory blocks, such as block-1 to block-N as shown in FIG. 1. In some examples, concurrent operations can take place at different memory planes 160. In some embodiments, each of the memory blocks block-1 to block-N is the smallest unit to carry out an erase operation. Each memory block includes a number of pages. In some examples, page is the smallest unit that can be programmed (i.e. written to).

In some embodiments, the memory cell array 102 is a flash memory array, and is implemented using 3D NAND flash memory technology. Each of the memory blocks block-1 to block-N includes a plurality of memory cell strings that are disposed vertically (e.g., perpendicular to a main surface of a die). Each memory cell string includes a plurality of transistors connected in series. The details of the memory cell string will be described with reference to FIG. 2.

In some embodiments, the peripheral circuitry 101 includes an interface circuitry 110 and a main controller 120 coupled together.

The interface circuitry 110 includes suitable circuitry to interface with the memory cell array 102 or to interface with external components of the semiconductor memory device 100, such as a host device. In some examples, the interface circuitry 110 includes a first portion that interfaces with a host device and is referred to as a host interface, and a second portion that interfaces with the memory cell array 102 and is referred to as an array interface. In the FIG. 1 example, the interface circuitry 110 includes a command decoding circuit 114, an address decoding circuit 115, a page buffer circuit 112, a data input/output (I/O) circuit 111, a voltage generator 113 and programmable logic cells 130 coupled together as shown in FIG. 1.

In some examples, the address decoding circuit 115 can receive address (ADDR) from I/O pins coupled to external circuitry (e.g., the host device) and perform decoding of the address. In some examples, the address decoding circuit 115 can operate with the main controller 120 to perform decoding of the address. In some embodiments, the received addresses from the host device are file system logical block addresses. In some examples, the address decoding circuit 115 and the main controller 120 can perform functions of a flash translation layer (FTL) to translate from block addresses used by a file system to addresses of physical cells in the memory cell array 102. In an example, the translation from block addresses used by the file system to physical cells in the memory cell array 102 can be used to exclude bad cells. In some embodiments, the addresses of the physical cells are in the form of row address (R-ADDR) and column address (C-ADDR). In response to the row address, the address decoding circuit 115 can generate the word line (WL) signals and select signals, such as top select gate (TSG) signal(s), bottom select gate (BSG) signal(s), and the like based on the row address and provide the memory cell array 102 with the WL signals, and select signals. In some examples, during a write operation, the address decoding circuit 115 provides the WL signals and the select signals to the memory cell array 102 to select a page to program. During a read operation, the address decoding circuit 115 can provide the WL signals and the select signals to select a page for buffering. During an erase operation, the address decoding circuit 115 can provide suitable the WL signals and the select signals.

The page buffer circuit 112 is coupled to bit lines (BL) of the memory cell array 102 and configured to buffer data, such as one or more pages of data during read and write operations. In an example, during a write operation, the page buffer circuit 112 can buffer data to be programed and drive the data to bit lines of the memory cell array 102 to write the data into the memory cell array 102. In another example, during a read operation, the page buffer circuit 112 can sense data on the bit lines of the memory cell array 102 and buffer the sensed data for outputting.

In the FIG. 1 example, the data I/O circuit 111 is coupled to the page buffer circuit 112 via data lines (DL). In an example (e.g., during a write operation), the data I/O circuit 111 is configured to receive data from external circuitry (e.g., the host device) of the semiconductor memory device 100, and provide the received data to the memory cell array 102 via the page buffer circuit 112. In another example (e.g., during a read operation), the data I/O circuit 111 is configured to output the data from the memory cell array 102 to external circuitry (e.g., host device) based on the column address (C-ADDR).

The voltage generator 113 is configured to generate voltages of suitable levels for the proper operations of the semiconductor memory device 100. For example, during a read operation, the voltage generator 113 can generate voltages of suitable levels for source voltages, body voltage, various WL voltages, select voltages, and like that for the read operation. In some examples, the source voltages are provided as an array common source (ACS) voltages to the source terminals of the memory cell array 102 during the read operation; the body voltage is provided to, for example a P-type well (PW) that is the body portion for the memory cell strings, during the read operation. The WL voltages and the select voltages are provided to the address decoding circuit 115, thus the address decoding circuit 115 can output the WL signals and the select signals (e.g. TSG signals and BSG signals) at the suitable voltage level during the read operation.

In another example, during an erase operation, the voltage generator 113 can generate voltages of suitable levels for source voltages, body voltage, various WL voltages, select voltages, BL voltages and like that are suitable for the erase operation. In some examples, the source voltage is provided as ACS voltages to the source terminals of the memory cell array 102 during the erase operation; the PW voltage is provided to the P-type well that is the body portion for the memory cell strings during the erase operation. The WL voltages and the select voltages are provided to the address decoding circuit 115, thus the address decoding circuit 115 can output the WL signals and the BSG and TSG signals at the suitable voltage level during the erase operation. The BL voltages are provided to the page buffer circuit 112, thus the page buffer circuit 112 can drive the bit lines (BL) at proper voltage level during the erase operation. It is noted that the BL voltage may be applied to the bit lines without going through the page buffer circuit 112.

In some embodiments, the command decoding circuit 114 is configured to receive commands (CMD) from, for example the host device via I/O pins in command cycles. In some embodiments, the I/O pins can transmit other information, such as addresses in address cycles, data in data cycles. In some embodiments, the received commands are commands according to certain high level protocols (e.g., USB protocols).

In some embodiments, the command decoding circuit 114 and the main controller 120 can operate together to decode the received commands. In an example, the command decoding circuit 114 performs initial decoding of the received commands and the decoded commands by the command decoding circuit 114 are provided to the main controller 120 for further processing. The main controller 120 can perform further decoding, and then generate control parameters for controlling other circuits, such as the page buffer circuit 112, the data I/O circuit 111, the voltage generator 113, and the like based on the commands.

In some embodiments, the main controller 120 can control the voltage generator 113 to generate voltages of suitable levels based on the commands. The main controller 120 can coordinate the other circuits, to provide signals to the memory cell array 102 at the suitable time and suitable voltage levels.

The main controller 120 can be implemented using any suitable techniques. In the FIG. 1 example, the main controller 120 is implemented as a microcontroller unit (MCU) 121 and a firmware (FW) memory 125. The MCU 121 includes one or more processing cores, the FW memory 125 stores firmware that can be executed by the one or more processing cores. For example, the firmware includes a read module, a program module and an erase module. The MCU 121 can execute the read module in response to a read command to generate control parameters for generating control signals to read data from the memory cell array 102. The MCU 121 can execute the program module in response to a program command to generate control parameters for generating control signals to write data to the memory cell array 102. The MCU 121 can execute the erase module in response to an erase command to generate control parameters for generating control signals to erase one or more blocks of the memory cell array 102.

It is noted that FW memory 125 can be implemented using any suitable non-volatile memory that can retain stored data even power is disconnected. In an example, the FW memory 125 is implemented using read-only memory (ROM). In another example, the FW memory 125 is implemented using programmable ROM. In another example, the FW memory 125 is implemented using erasable programmable ROM.

According to the present disclosure, the programmable logic cells 130 in the peripheral circuitry 101 can be suitably configured to perform various logic functions. In some embodiments, the programmable logic cells 130 can be configured in response to configuration signals received via I/O pins from external devices.

In some embodiments, the programmable logic cells 130 can be configured based on configurations stored in the memory cell array 102, such as configurations 135 stored in the memory cell array 102. For example, the configurations 135 are stored in an initialization partition 165 in the memory cell array 102. The initialization partition 165 is a portion of the memory cell array 102 that can be loaded to the peripheral circuitry 101 at a time when the semiconductor memory device 100 is powered on. In some examples, at the time of power on, information in the initialization partition 165 is loaded into the peripheral circuitry 101 to configure the peripheral circuitry 101. The programmable logic cells 130 can be configured according to the configurations 135.

The programmable logic cells 130 can be implemented using various techniques. An exemplary technique will be described with reference to FIG. 3.

In the FIG. 1 example, the programmable logic cells 130 can be configured to perform various functions. The programmable logic cells 130 can be configured at the time of power on during operation and has a more flexible development schedule than regular hardware implementation. Also, cells in the programmable logic cells 130 can operation in parallel, and have a much faster processing speed than firmware based implementation.

In an embodiment, the programmable logic cells 130 can be used to implement functions that are determined after hardware validation. Thus, the functions can be implemented with flexible development schedule and fast processing speed.

In another embodiment, bugs in hardware are detected after wafer fabrication. The programmable logic cells 130 can be configured to fix the bugs in hardware.

In another embodiment, customers provide feedback and request additional functions. The programmable logic cells 130 can be used to implement the additional functions requested from customer feedback and provide quick customer satisfaction.

In another embodiment, certain control parameters for the memory cells array 102 are critical and difficulty to decide before fabrication. In some examples, the control parameters may rely on testing or characterization that is performed after fabrication. In some examples, the programmable logic cells 130 can be used to implement word line bias settings, voltage level calculations, and the like that are determined after silicon fabrication.

In another embodiment, the programmable logic cells 130 can be used to implement build-in-self-test (BIST) functions to save testing cost.

In another embodiment, the programmable logic cells 130 are configured to implement additional computing capability. In an example, the programmable logic cells 130 are configured to implement an error correcting code (ECC) engine for error correction. In another example, the programmable logic cells 130 are configured to implement on-die read level calibration. In another example, the programmable logic cells 130 are configured to implement reference voltage level (Vref) training engine.

In another embodiment, the programmable logic cells 130 are configured to implement functions that may require fast processing, such as some functions in the flash translation layer (FTL), and the like.

In another embodiment, the programmable logic cells 130 are configured to implement functions that provide smooth co-operation between the host device and the semiconductor memory device 100.

Figure 2:
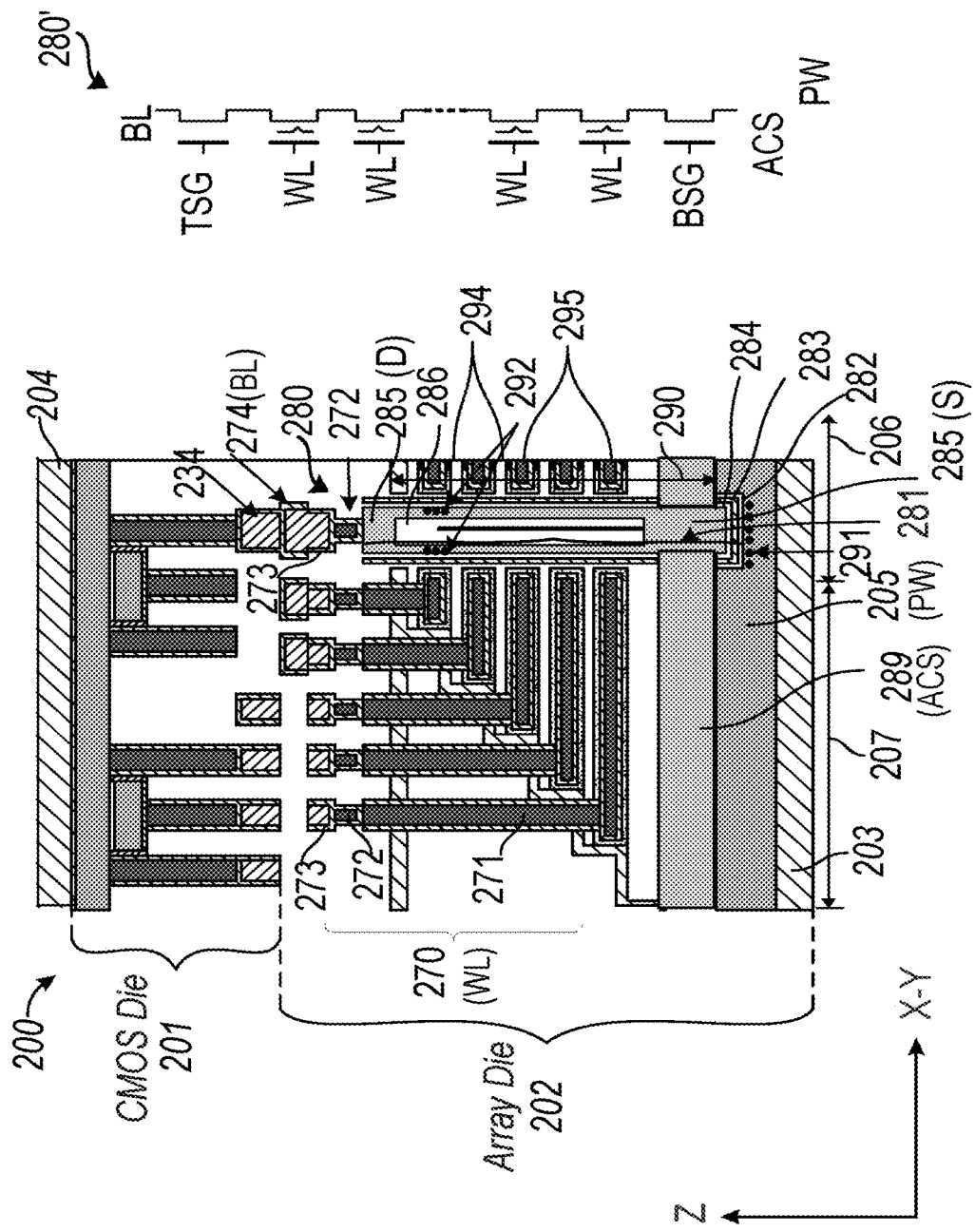
FIG. 2 shows a cross-sectional view of a semiconductor memory device and a schematic symbol of a memory cell string according to some embodiments of the disclosure.

FIG. 2 shows a cross-sectional view of a semiconductor memory device 200 according to some embodiments of the disclosure. The semiconductor memory device 200 can be the semiconductor memory device 100 in some examples. The semiconductor memory device 200 includes an array die 202 (also referred to as array chip in some examples) and a CMOS die 201 (also referred to as CMOS chip in some examples) bonded together according to some embodiments of the disclosure.

It is noted that, in some embodiments, a semiconductor memory device can include multiple array dies and a CMOS die. The multiple array dies and the CMOS die can be stacked and bonded together. The CMOS die is respectively coupled to the multiple array dies, and can drive the respective array dies to operate in the similar manner as the semiconductor memory device 200.

The array die 202 includes a substrate 203, and memory cells formed on the substrate 203. The CMOS die 201 includes a substrate 204, and peripheral circuitry formed on the substrate 204. For simplicity, the main surface of the substrate 203 is referred to as an X-Y plane, and the direction perpendicular to the main surface is referred to as Z direction.

The substrate 203 and the substrate 204 respectively can be any suitable substrate, such as a silicon (Si) substrate, a germanium (Ge) substrate, a silicon-germanium (SiGe) substrate, and/or a silicon-on-insulator (SOI) substrate. The substrate 203 and the substrate 204 respectively may include a semiconductor material, for example, a Group IV semiconductor, a Group III-V compound semiconductor, or a Group II-VI oxide semiconductor. The Group IV semiconductor may include Si, Ge, or SiGe. The substrate 203 and the substrate 204 respectively may be a bulk wafer or an epitaxial layer.

The semiconductor memory device 200 includes memory cell arrays (e.g., memory circuit array 102) and peripheral circuitry (e.g., the address decoding circuit, the page buffer circuit, the data I/O circuit, the voltage generator, the main controller and the like). In the FIG. 2 example, the memory cell arrays are formed on the substrate 203 of the array die 202 and the peripheral circuitry is formed on the substrate 204 of the CMOS die 201. The array die 202 and the CMOS die 201 are disposed face to face (the surface with circuitry disposed on is referred to as face, and the opposite surface is referred to as back), and bonded together.

In some examples, wells can be formed in the substrate 202 respectively for blocks as body portions for the blocks. In the FIG. 2 example, a P-type well 205 is formed in the substrate 203, and a block of three dimensional (3D) NAND memory cell strings can be formed in the P-type well 205. The P-type well 205 can form a body portion (e.g., in connection with a PW terminal) for the 3D NAND memory cell strings, and a voltage that is referred to as PW can be applied to the P-type well 205 via the PW terminal. In some examples, the memory cell array is formed in a core region 206 as an array of vertical memory cell strings. Besides the core region 206 and the periphery region, the array die 202 includes a staircase region 207 (also referred to as a connection region in some examples) to facilitate making connections to, for example, gates of the memory cells in the vertical memory cell strings, gates of the select transistors, and the like. The gates of the memory cells in the vertical memory cell strings correspond to word lines for the NAND memory architecture.

In the FIG. 2 example, a vertical memory cell string 280 is shown as representation of an array of vertical memory cell strings formed in the core region 206. FIG. 2 also shows a schematic symbol version of the vertical memory cell string 280' corresponding to the vertical memory cell string 280. The vertical memory cell strings 280 are formed in a stack of layers 290. The stack of layers 290 includes gate layers 295 and insulating layers 294 that are stacked alternatingly. The gate layers 295 and the insulating layers 294 are configured to form transistors that are stacked vertically. In some examples, the stack of transistors includes memory cells and select transistors, such as one or more bottom select transistors, one or more top select transistors and the like. In some examples, the stack of transistors can include one or more dummy select transistors. The gate layers 295 correspond to gates of the transistors. The gate layers 295 are made of gate stack materials, such as high dielectric constant (high-k) gate insulator layers, metal gate (MG) electrode, and the like. The insulating layers 294 are made of insulating material(s), such as silicon nitride, silicon dioxide, and the like.

According to some aspects of the disclosure, the vertical memory cell strings are formed of channel structures 281 that extend vertically (Z direction) into the stack of layers 290. The channel structures 281 can be disposed separate from each other in the X-Y plane. In some embodiments, the channel structures 281 are disposed in the form of arrays between gate line cut structures (not shown). The gate line cut structures are used to facilitate replacement of sacrificial layers with the gate layers 295 in a gate-last process. The arrays of the channel structures 281 can have any suitable array shape, such as a matrix array shape along the X direction and the Y direction, a zig-zag array shape along the X or Y direction, a beehive (e.g., hexagonal) array shape, and the like. In some embodiments, each of the channel structures has a circular shape in the X-Y plane, and a pillar shape in the X-Z plane and Y-Z plane. In some embodiments, the quantity and arrangement of the channel structures between gate line cut structures is not limited.

In some embodiments, the channel structure 281 has a pillar shape that extends in the Z direction that is perpendicular to the direction of the main surface of the substrate 203. In an embodiment, the channel structure 281 is formed by materials in the circular shape in the X-Y plane, and extends in the Z direction. For example, the channel structure 281 includes function layers, such as a blocking insulating layer 282 (e.g., silicon oxide), a charge storage layer (e.g., silicon nitride) 283, a tunneling insulating layer 284 (e.g., silicon oxide), a semiconductor layer 285, and an insulating layer 286 that have the circular shape in the X-Y plane, and extend in the Z direction. In an example, the blocking insulating layer 282 (e.g., silicon oxide) is formed on the sidewall of a hole (into the stack of layers 280) for the channel structure 281, and then the charge storage layer (e.g., silicon nitride) 283, the tunneling insulating layer 284, the semiconductor layer 285, and the insulating layer 286 are sequentially stacked from the sidewall. The semiconductor layer 285 can be any suitable semiconductor material, such as polysilicon or monocrystalline silicon, and the semiconductor material may be un-doped or may include a p-type or n-type dopant. In some examples, the semiconductor material is intrinsic silicon material that is un-doped. However due to defects, intrinsic silicon material can have a carrier density in the order of $10^{10}$ $cm^{-3}$ in some examples. The insulating layer 286 is formed of an insulating material, such as silicon oxide and/or silicon nitride, and/or may be formed as an air gap.

According to some aspects of the disclosure, the channel structure 281 and the stack of layers 290 together form the memory cell string 280. For example, the semiconductor layer 285 corresponds to the channel portions for transistors in the memory cell string 280, and the gate layers 295 corresponds to the gates of the transistors in the memory cells string 280. Generally, a transistor has a gate that controls a channel, and has a drain and a source at each side of the channel. For simplicity, in the FIG. 2 example, the upper side of the channel for transistors in FIG. 2 is referred to as the drain, and the bottom side of the channel for transistors in FIG. 2 is referred to as the source. It is noted that the drain and the source can be switched under certain driving configurations. In the FIG. 2 example, the semiconductor layer 285 corresponds to connected channels of the transistors. For a specific transistor, the drain of the specific transistor is connected with a source of an upper transistor above the specific transistor, and the source of the specific transistor is connected with a drain of lower transistor below the specific transistor. Thus, the transistors in the memory cell string 280 are connected in series.

The memory cell string 280 includes memory cell transistors (or referred to as memory cells). A memory cell transistor can have different threshold voltages based on carrier trappings in a portion of the charge storage layer 283 that corresponds to a floating gate for the memory cell transistor. For example, when a significant amount of holes are trapped (stored) in the floating gate of the memory cell transistor, the threshold voltage of the memory cell transistor is lower than a predefined value, then the memory cell transistor is in a un-programed state (also referred to as erased state) corresponding to logic "1". When holes are expelled from the floating gate, the threshold voltage of the memory cell transistor is above a predefined value, thus the memory cell transistor is in a programed state corresponding to logic "0" in some examples.

The memory cell string 280 includes one or more top select transistors configured to couple/de-couple the memory cells in the memory cell string 280 to a bit line, and includes one or more bottom select transistors configured to couple/de-couple the memory cells in the memory cell string 280 to the ACS.

The top select transistors are controlled by top select gates (TSG). For example, when a TSG voltage (voltage applied to the TSG) is larger than a threshold voltage of the top select transistors, the top select transistors are turned on and the memory cells are coupled to the bit line; and when the TSG voltage (voltage applied to the TSG) is smaller than the threshold voltage of the top select transistors, the top select transistors are turned off and the memory cells are de-coupled to the bit line.

Similarly, the bottom select transistors are controlled by bottom select gates (BSG). For example, when a BSG voltage (voltage applied to the BSG) is larger than a threshold voltage of the bottom select transistors, the bottom select transistors are turned on and the memory cells are coupled to the ACS; and when the BSG voltage (voltage applied to the BSG) is smaller than the threshold voltage of the bottom select transistors, the bottom select transistors are turned off and the memory cells are de-coupled to the ACS.

According to some aspects of the disclosure, the bottom portion of the semiconductor layer 285 in the channel hole corresponds to a source side of the vertical memory cell string 280, and the bottom portion is labeled as 285(S). A common source layer 289 is formed in conductive connection with the source of the vertical memory cell string 280. The common source layer 289 can includes one or more layers. In some examples, the common source layer 289 includes silicon material, such as intrinsic polysilicon, doped polysilicon (such as N-type doped silicon, P-type doped silicon) and the like. In some examples, the common source layer 289 may include metal silicide to improve conductivity. The common source layer 289 is similarly in conductive connection with sources of other vertical memory cell strings (not shown), and thus forms an array common source (ACS).

In some examples, when the vertical memory cell strings 280 are configured to be erased by block, the common source layer 289 can extend and cover the core regions of a block and staircase regions for the block. In some examples, for different blocks that are erased separately, the common source layer 289 may be suitably insulated for the different blocks.

In the FIG. 2 example, in the channel structure 281, the semiconductor layer 285 extends vertically from the source side of the channel structure 281 up, and forms a top portion corresponds to a drain side of the vertical memory cell string 280. The top portion of the semiconductor layer 285 is labeled as 285(D). It is noted that drain side and the source side are named for the ease of description. The drain side and the source side may function differently from the names.

In the FIG. 2 example, a connection structure, such as a via 272 with a metal wire 273, a bonding structure 274, and the like, can be formed to electrically couple the top portion of the semiconductor layer 285(D) to a bit line (BL).

Further in FIG. 2 example, the staircase region 207 includes a staircase that is formed to facilitate word line connections to the gates of transistors (e.g., memory cells, top select transistor(s), bottom select transistor(s)). For example, a word line connection structure 270 includes a contact structure 271, a via structure 272, and metal wire 273 that are conductively coupled together. The word line connection structure 270 can electrically couple a WL to a gate terminal of a transistor in the memory cell string 280.

In the FIG. 2 example, the array die 202 and the CMOS die 201 are disposed face-to-face (circuitry side is face, and the substrate side is back) and bonded together. Generally, the peripheral circuitry on the CMOS die interfaces the semiconductor memory device 200 with external circuitry.

In the FIG. 2 example, the CMOS die 201 and the array die 202 respectively include bonding structures that can be aligned with each other. For example the CMOS die 201 includes a bonding structure 234 and the array die 202 includes a corresponding bonding structure 274. The array die 202 and the CMOS die 201 can be suitably aligned, thus the bonding structure 234 is aligned with the bonding structure 274. When the array die 202 and the CMOS die 201 are bonded together, the bonding structure 234 is respectively bonded and electrically coupled with the bonding structure 274.

Figure 3:
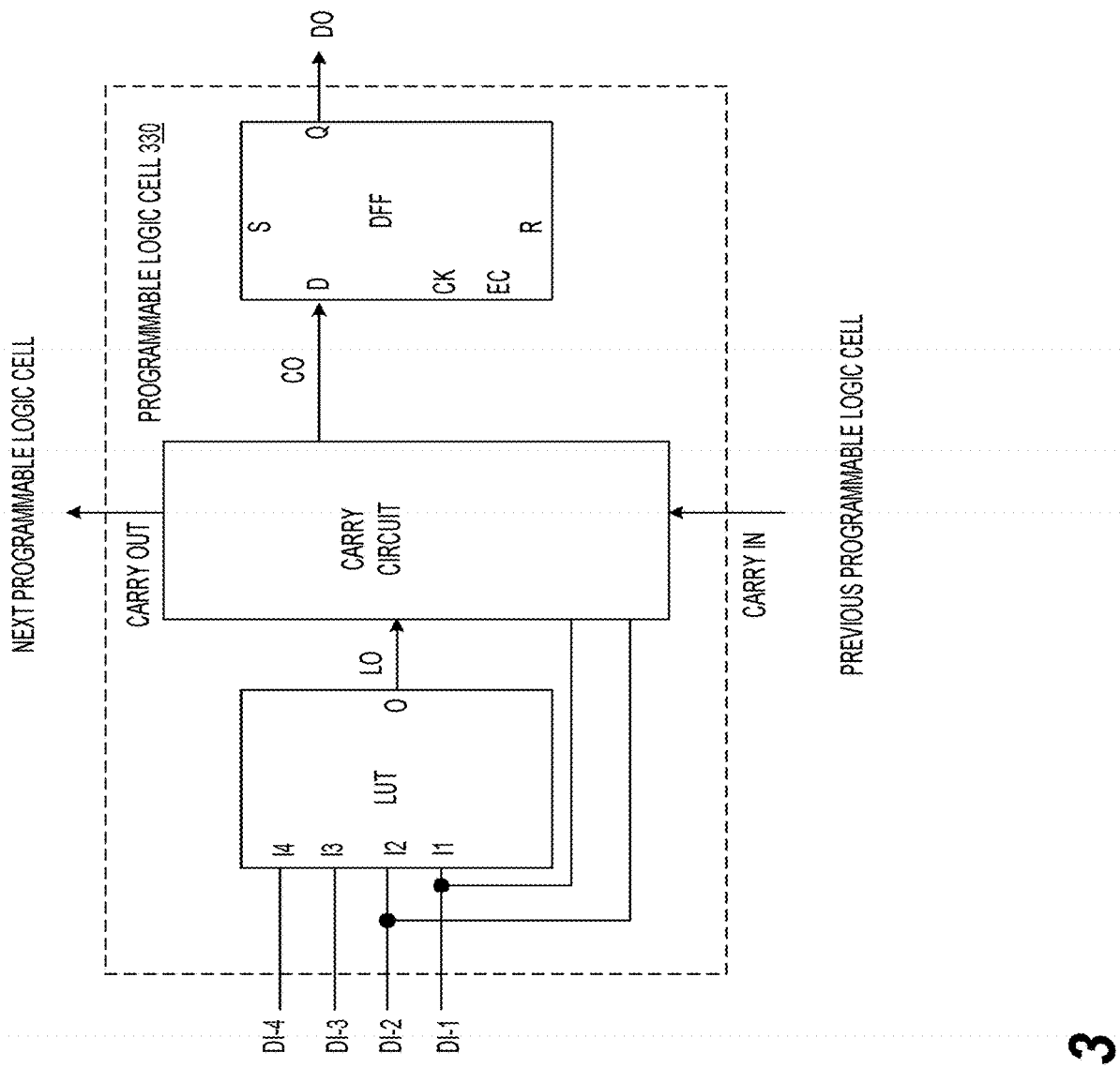
FIG. 3 shows a diagram of a programmable logic cell according to some embodiments of the disclosure.

FIG. 3 shows a diagram of a programmable logic cell 330 according to some embodiments of the disclosure. The programmable logic cell 330 is a cell in an array of programmable logic cells, such as the programmable logic cells 130. Other cells in the array of programmable logic cells can be similarly configured as the programmable logic cell 330. The programmable logic cell 330 is positioned between a previous programmable logic cell and a next programmable logic cell.

In the FIG. 3 example, the programmable logic cell 330 includes a lookup table (LUT), a carry circuit, and a D flip flop (DFF) coupled together as shown. The LUT receives a plurality of inputs, such as four inputs DI-1 to DI-4, and generates a LUT output LO. The carry circuit receives a carry in from the previous programmable logic cell, and combines the carry in with the LUT output LO to generate a cell output CO and a carry out to the next programmable logic cell. The D flip flop can capture and output the cell output CO in response to clock signals.

In some examples, the LUT is implemented using 16 static random access memory (SRAM) cells, and each SRAM cell is associated with a binary combination of the inputs. For example, SRAM cell 1 is associated with "0000", SRAM cell 2 is associated with "0001", SRAM cell 3 is associated with "0010", SRAM cell 4 is associated with "0011", SRAM cell 5 is associated with "0100", SRAM cell 6 is associated with "0101", SRAM cell 7 is associated with "0110", SRAM cell 8 is associated with "0111", SRAM cell 9 is associated with "1000", SRAM cell 10 is associated with "1001", SRAM cell 11 is associated with "1010", SRAM cell 12 is associated with "1011", SRAM cell 13 is associated with "1100", SRAM cell 14 is associated with "1101", SRAM cell 15 is associated with "1110", SRAM cell 16 is associated with "1111". During operation, one of the SRAM cells that is associated with the binary combination of the inputs DI-1 to DI-4 can be selected as output LO of the LUT. The 16 SRAM cells can be programed to store any suitable logic operations of the inputs DI-1 to DI-4.

It is noted that the programmable logic cell 330 is merely an example, the programmable logic cells 130 can be implemented using any suitable techniques.

Figure 4:
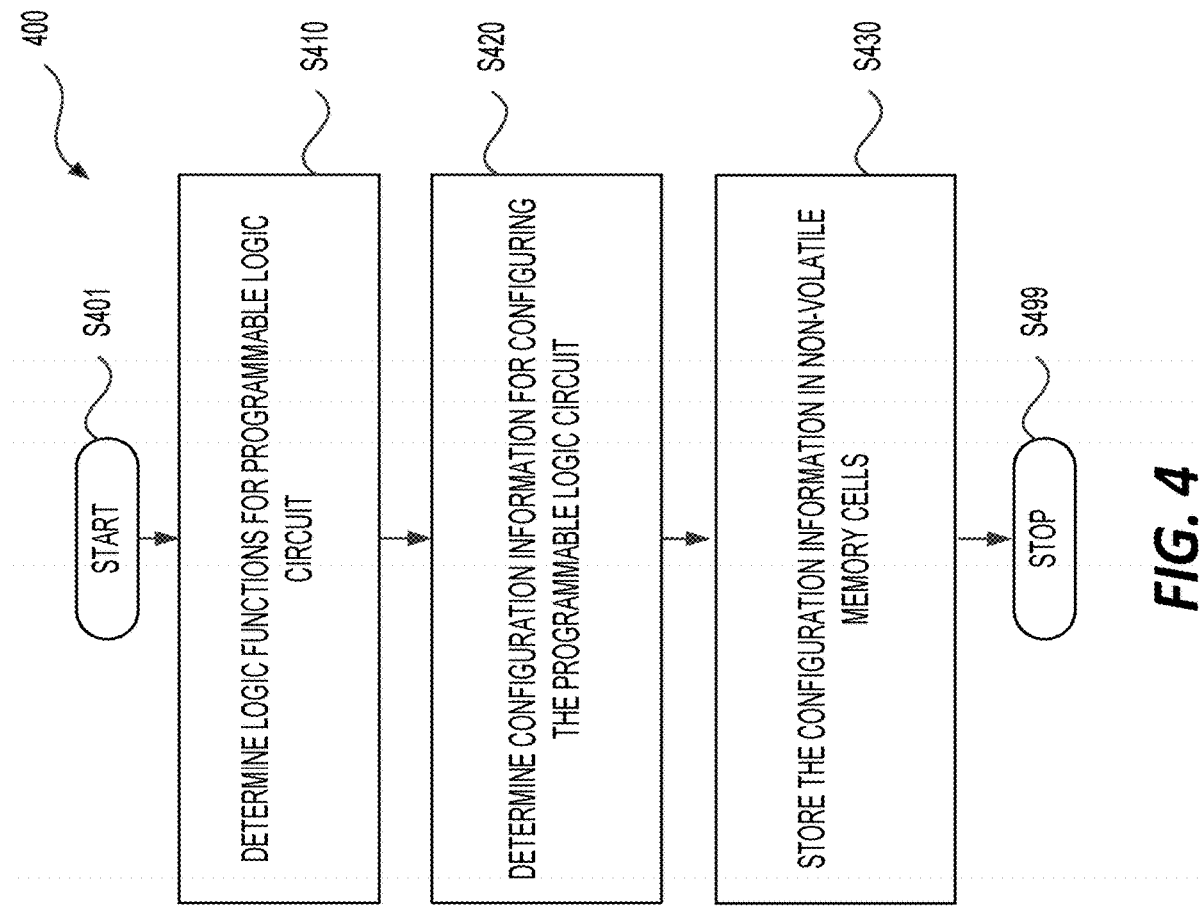
FIG. 4 shows a flow chart outlining a process according to some embodiments of the disclosure.

FIG. 4 shows a flow chart outlining a process 400 according to some embodiments of the disclosure. In some examples, the process 400 is performed by a semiconductor memory device provider who provides a semiconductor memory device that incudes programmable logic circuit (e.g., programmable logic cells 130), such as the semiconductor memory device 100, the semiconductor memory device 200 and the like. In some examples, the semiconductor memory device includes a first die (e.g., array die), and a second die (e.g., CMOS die). The first die incudes a memory cell array, and the second die includes the peripheral circuitry of the memory cell array. The first die and the second die are bonded together, thus the peripheral circuitry is conductively coupled with the memory cell array. The programmable logic circuit is disposed with the peripheral circuitry. In some embodiments, the memory cell array is non-volatile memory cell array. The memory cells in the non-volatile memory cell array can retain stored data even power is disconnected. The process 400 starts at S401 and proceeds to S410.

At S410, logic functions for the programmable logic circuit are determined. In some embodiments, the semiconductor memory device provider determines the logic functions after the hardware validation. In an embodiment, the semiconductor memory device provider determines the logic functions to fix bugs in hardware. In another embodiment, the semiconductor memory device provider determines the logic functions that are difficult to determine at the stage of hardware design, such as word line bias settings for the memory cell array, voltage levels for programing/erasing/read the memory cell array, and the like. In another embodiment, the semiconductor memory device provider determines the logic functions in response to customer feedback based on previous usages. In another embodiment, the semiconductor memory device provider determines the logic functions that include BIST functions. In another embodiment, the logic functions include address translation between a file system and the memory cell array.

At S420, configuration information for configuring the programmable logic circuit is determined based on the logic functions. In some embodiments, the programmable logic circuit incudes a plurality of programmable logic cells. In some examples, each programmable logic cell includes a LUT for a plurality of logic inputs. The LUT includes entries that respectively binary combinations of the logic inputs with random access memory cells, such as SRAM cells. The configuration information is indicative of values to store to the random access memory cells in order to cause the programmable logic circuit to perform the logic functions.

At S430, the configuration information is stored in the non-volatile memory cells in the memory cell array. For example, the semiconductor memory device provider can connect a host device with the semiconductor memory device and the host device can write the configuration information to the non-volatile memory cells in the memory cell array. Then, the process proceeds to S499 and terminates.

In some embodiments, the configuration information is stored in an initialization partition in the memory cell array. Information in the initialization partition is read to the peripheral circuity in response to a power-on of the semiconductor memory device during operations of the semiconductor memory device. In an example, when the semiconductor memory device is powered on, the peripheral circuitry causes the information in the initialization partition to be read. Based on the configuration information, the peripheral circuitry can write suitable values to the random access memory cells in the programmable logic circuit to cause the programmable logic circuit to perform the logic functions.

Figure 5:
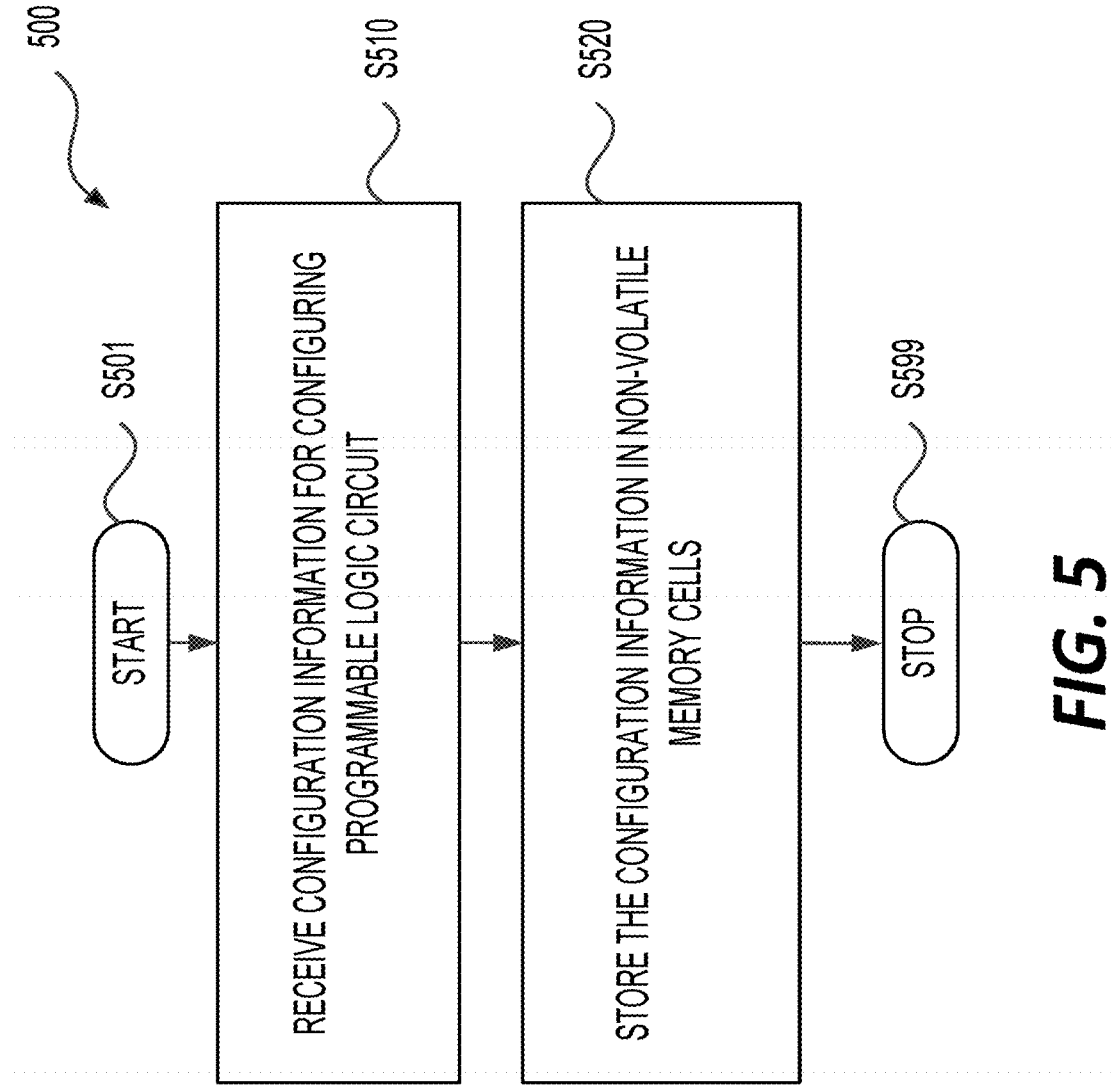
FIG. 5 shows a flow chart outlining a process according to some embodiments of the disclosure.

FIG. 5 shows a flow chart outlining a process 500 according to some embodiments of the disclosure. In some examples, the process 500 is performed by a user of a semiconductor memory device. In some examples, the semiconductor memory device includes a first die (e.g., array die), and a second die (e.g., CMOS die). The first die incudes a memory cell array, and the second die includes the peripheral circuitry of the memory cell array. The first die and the second die are bonded together, thus the peripheral circuitry is conductively coupled with the memory cell array. The programmable logic circuit is disposed with the peripheral circuit. In some embodiments, the memory cell array is non-volatile memory cell array. The memory cells in the non-volatile memory cell array can retain stored data even power is disconnected. The process 500 starts at S501 and proceeds to S510.

At S510, configuration information for configuring programmable logic circuit is received. In an example, the user couples a host device with the semiconductor memory device. The host device can receive the configuration information, for example, from a server. In another example, an application installed on the host device can determine to use the programmable logic circuit to perform certain functions, such as ECC engine for error detection and correction, on-die read level calibration, reference voltage level (Vref) training engine and the like, and then determines the configuration information for configuring the programmable logic circuit.

At S520, the configuration information is stored in the non-volatile memory cells in the memory cell array. For example, the host device can write the configuration information to the non-volatile memory cells in the memory cell array. Then, the process proceeds to S599 and terminates.

In some embodiments, the configuration information is stored in an initialization partition in the memory cell array. Information in the initialization partition is read to the peripheral circuity in response to a power-on of the semiconductor memory device during operations of the semiconductor memory device. In an example, when the semiconductor memory device is powered on, the peripheral circuitry causes the information in the initialization partition to be read. Based on the configuration information, the peripheral circuitry can write suitable values to the random access memory cells in the programmable logic circuit to cause the programmable logic circuit to perform the logic functions.

Figure 6:
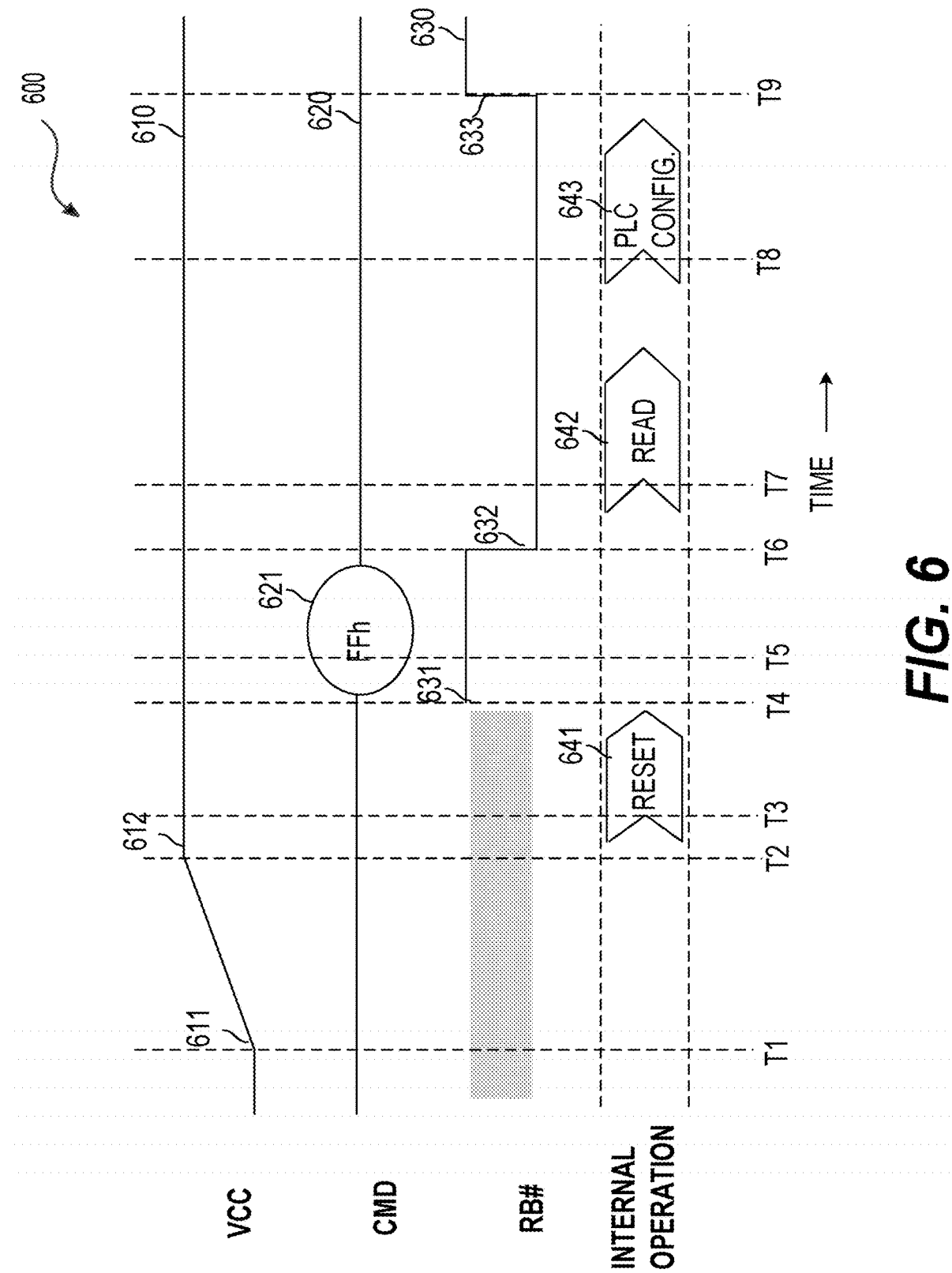
FIG. 6 shows a diagram illustrating a sequence of power on operations according to some embodiments of the disclosure.

FIG. 6 shows a diagram 600 illustrating a sequence of power on operations according to some embodiments of the disclosure. The diagram 600 includes a power signal 610, received command (CMD) 620, a ready/busy (RB #) signal 630, and internal operation 640.

In some examples, the power signal 610 is provided to a power pin of a semiconductor memory device, such as the semiconductor memory device 100, the semiconductor memory device 200 and the like; the CMD 620 is received on certain I/O pins during command cycles; the ready/busy (RB #) signal 630 is used to inform a host device the status of the semiconductor memory device (e.g., high for ready and low for busy).

In the FIG. 6 example, the sequence of operations is described with reference to time T1-T9.

At T1, a power supply is provided, and a voltage level at the power pin starts to rise, as shown by 611.

At T2, the voltage level at the power pin is stable as shown by 612.

At T3, in response to the power on, a reset pulse can be generated and cause the semiconductor memory device to reset to a known state, as shown by 641.

At T4, the RB #signal is high to inform that the semiconductor memory device is ready as shown by 631.

At T5, a first command after power on is provided from the host device. Generally, the first command is a reset command (FFh), as shown by 621.

At T6, the RB #signal goes low to inform that the semiconductor memory device is busy as shown by 632.

At T7, in response to the reset command, information in the initialization partition of the memory cell array is read from the memory cell array to the peripheral circuitry as shown by 642. The configuration information for configuring the programmable logic circuit is stored in the initialization partition and thus is read to the peripheral circuitry.

At T8, the peripheral circuitry configures the programmable logic circuit according to configuration information as shown by 643, thus the programmable logic circuit is able to perform the logic functions corresponding to the configuration information.

At T9, the RB #signal rise high to inform that the semiconductor memory device is ready for further operations as shown by 633.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor memory device, comprising:
a memory cell array comprising a plurality of memory cells; and
peripheral circuitry coupled with the memory cell array, the peripheral circuitry comprising:
programmable logic circuit that is configured, after the semiconductor memory device is powered on, to perform logic functions, wherein
the memory cell array is formed on a first substrate of a first die, the peripheral circuitry is formed on a second substrate of a second die, and the memory cell array and the peripheral circuitry are bonded face to face and stacked in a direction perpendicular to the first substrate and the second substrate, and
the configuration information for configuring the programmable logic circuit is read from the memory cell array on the first substrate of the first die to the peripheral circuitry on the second substrate of the second die through a first bonding structure connected to the memory cell array and a second bonding structure connected to the peripheral circuitry.

2. The semiconductor memory device of claim 1, wherein the memory cell array comprises non-volatile memory cells that store the configuration information for configuring the programmable logic circuit.

3. The semiconductor memory device of claim 2, wherein the peripheral circuitry is configured to load the configuration information from the memory cell array, and configure the programmable logic circuit according to the configuration information at a time when the semiconductor memory device is powered on.

4. The semiconductor memory device of claim 3, wherein the configuration information for configuring the programmable logic circuit is stored in an initialization partition of the memory cell array, information in the initialization partition is read in response to a power-on of the semiconductor memory device.

5. The semiconductor memory device of claim 3, wherein the programmable logic circuit comprises at least a lookup table for a plurality of logic inputs, the lookup table comprises entries that respectively associate binary combinations of the logic inputs with random access memory cells.

6. The semiconductor memory device of claim 5, wherein the peripheral circuitry is configured to store values into the random access memory cells according to the configuration information at the time when the semiconductor memory device is powered on.

7. The semiconductor memory device of claim 1, wherein the programmable logic circuit is configured to perform at least one of:
determination of word line bias settings for the memory cell array; and
address translation between a virtual address of a file system and a physical address of the memory cell array.

8. The semiconductor memory device of claim 1, wherein:
the second die is conductively coupled with the first die.

9. The semiconductor memory device of claim 1, wherein the peripheral circuitry on the second substrate of the second die is configured to receive configuration signals from a source external of the semiconductor memory device, and configure the programmable logic circuit included in the peripheral circuitry on the second substrate of the second die according to the configuration signals from the source external of the semiconductor memory device.

10. A method for forming a semiconductor memory device, comprising:
determining logic functions for programmable logic circuit that is disposed in peripheral circuitry for a memory cell array in the semiconductor memory device, the memory cell array comprising non-volatile memory cells;
determining configuration information for configuring the programmable logic circuit to perform the logic functions; and
storing the configuration information in the non-volatile memory cells, the configuration information being used to configure the programmable logic circuit when the semiconductor memory device is powered on, wherein
the memory cell array is formed on a first substrate of a first die, the peripheral circuitry is formed on a second substrate of a second die, and the memory cell array and the peripheral circuitry are bonded face to face and stacked in a direction perpendicular to the first substrate and the second substrate, and
the configuration information for configuring the programmable logic circuit is read from the memory cell array on the first substrate of the first die to the peripheral circuitry on the second substrate of the second die through a first bonding structure connected to the memory cell array and a second bonding structure connected to the peripheral circuitry.

11. The method of claim 10, further comprising:
storing the configuration information for configuring the programmable logic circuit in an initialization partition of the memory cell array, information in the initialization partition is read in response to a power-on of the semiconductor memory device.

12. The method of claim 11, further comprising:
storing the configuration information for configuring at least a lookup table in the programmable logic circuit, the lookup table comprising entries that respectively associate binary combinations of logic inputs with random access memory cells.

13. The method of claim 12, further comprising:
reading, in response to a power-on of the semiconductor memory device, the configuration information from the memory cell array to the peripheral circuitry; and storing, values into the random access memory cells according to the configuration information.

14. The method of claim 10, wherein the programmable logic circuit performs the logic functions including at least one of:
calculation of voltage levels for programing/erasing/read the memory cell array; and
build-in-self-test (BIST).

15. The method of claim 10, further comprising:
bonding together the first die and the second die, the bonding of the first die and the second die conductively coupling the peripheral circuitry with the memory cell array.

16. A method for using a semiconductor memory device, comprising:
receiving configuration information for configuring programmable logic circuit that is disposed in peripheral circuitry for a memory cell array in the semiconductor memory device, the memory cell array comprising non-volatile memory cells; and
storing the configuration information in the non-volatile memory cells, the configuration information being used to configure the programmable logic circuit when the semiconductor memory device is powered on, wherein
the memory cell array is formed on a first substrate of a first die, the peripheral circuitry is formed on a second substrate of a second die, and the memory cell array and the peripheral circuitry are bonded face to face and stacked in a direction perpendicular to the first substrate and the second substrate, and
the configuration information for configuring the programmable logic circuit is read from the memory cell array on the first substrate of the first die to the peripheral circuitry on the second substrate of the second die through a first bonding structure connected to the memory cell array and a second bonding structure connected to the peripheral circuitry.

17. The method of claim 16, further comprising:
storing the configuration information for configuring the programmable logic circuit in an initialization partition of the memory cell array, information in the initialization partition is read in response to a power-on of the semiconductor memory device.

18. The method of claim 17, further comprising:
storing the configuration information for configuring at least a lookup table in the programmable logic circuit, the lookup table comprising entries that respectively associate binary combinations of logic inputs with random access memory cells.

19. The method of claim 18, further comprising:
storing values into the random access memory cells according to the configuration information.

* * * * *